(12) United States Patent
Huang

(10) Patent No.: US 10,952,340 B1
(45) Date of Patent: Mar. 16, 2021

(54) MULTIFUNCTION STAND

(71) Applicant: Cheng Yu Huang, New Taipei (TW)

(72) Inventor: Cheng Yu Huang, New Taipei (TW)

( * ) Notice: Subject to any disclaimer, the term of this patent is extended or adjusted under 35 U.S.C. 154(b) by 0 days.

(21) Appl. No.: 16/864,362

(22) Filed: May 1, 2020

Related U.S. Application Data

(63) Continuation of application No. 16/735,985, filed on Jan. 7, 2020.

(51) Int. Cl.
| | |
|---|---|
| *H05K 5/00* | (2006.01) |
| *H05K 5/02* | (2006.01) |
| *H05K 5/03* | (2006.01) |
| *H05K 7/14* | (2006.01) |
| *H05K 1/18* | (2006.01) |
| *A47B 23/04* | (2006.01) |
| *H01R 12/71* | (2011.01) |
| *H01R 31/00* | (2006.01) |
| *H01R 31/02* | (2006.01) |

(52) U.S. Cl.
CPC ......... *H05K 5/0234* (2013.01); *A47B 23/043* (2013.01); *H01R 12/716* (2013.01); *H05K 1/181* (2013.01); *H05K 5/023* (2013.01); *H05K 5/03* (2013.01); *H05K 7/1427* (2013.01); *H01R 31/005* (2013.01); *H01R 31/02* (2013.01); *H05K 2201/10106* (2013.01); *H05K 2201/10189* (2013.01)

(58) Field of Classification Search
USPC .......................................................... 361/752
See application file for complete search history.

(56) References Cited

U.S. PATENT DOCUMENTS

| | | | | |
|---|---|---|---|---|
| 4,161,302 | A * | 7/1979 | Stuhlman | E04D 13/08 239/275 |
| 6,102,344 | A * | 8/2000 | Kasvin | A61B 90/60 248/118 |
| 2015/0219272 | A1* | 8/2015 | Miller | F16M 11/38 248/405 |

* cited by examiner

*Primary Examiner* — Hung S. Bui
(74) *Attorney, Agent, or Firm* — Demian K. Jackson; Jackson IPG PLLC

(57) ABSTRACT

A stand includes a base including a seat, a cover having a front groove, and a PCB in the seat; a stem extending from the base and including a rear plate having a trough, a receptacle having LEDs, a front transparent covering, a tubular member on top of the rear plate, and a sliding groove in the rear plate; a holder on top of the stem and including upper and lower slides, the upper and lower slides being slidable each other and through the tubular member; and an attachment mechanism including an insert releasably secured to the seat, a guide member extending upward from the insert into the sliding groove, a handle secured to the guide member through the lengthwise trough, and two biasing members each having two ends secured to the guide member and urging against the rear plate respectively. Alternatively, the slides are replaced by pivotal supports.

4 Claims, 11 Drawing Sheets

MULTIFUNCTION STAND

BACKGROUND OF THE INVENTION

1. Field of the Invention

The invention relates to stands and more particularly to a multifunction stand capable of supporting one or two headphones, a mobile phone, a tablet computer, or the like.

2. Description of Related Art

Conventionally, a stand (e.g., headphone stand) is capable of hanging one kind of device (e.g., headphone). For example, an individual may have to use two different types of stand to hang a headphone and support a mobile phone respectively. However, it not only occupies space of a table but also increases a financial burden on a consumer.

Thus, the need for providing a multifunction stand exists.

SUMMARY OF THE INVENTION

It is therefore one object of the invention to provide a stand comprising a base including a seat, a cover releasably secured to the seat and having a front groove and a cavity, and a PCB disposed in the seat, the PCB having a USB input header, a DC power connector, an audio header, a USB-C input header, and a plurality of USB output headers; a stem extending upward from the base and including a rear plate having a lengthwise trough on an outer surface, an intermediate receptacle having a plurality of LEDs and a conductor electrically connected the LEDs to the PCB, a front transparent covering, a tubular member at a top end of the rear plate, and a sliding groove in the rear plate facing the receptacle; a holder at a top end of the stem and including an upper slide having a flange at an open end, and a lower slide having a flange at an open end wherein the upper slide and the lower slide are configured to slide each other, the upper slide is configured to slide through the tubular member, and the lower slide is configured to slide through the tubular member; and an attachment mechanism including an insert releasably secured to the seat, a guide member extending upward from an open end of the insert into the sliding groove, a handle secured to the guide member through the lengthwise trough of the rear plate, and two biasing members each having a lower end secured to a top of the guide member and an upper end urging against an inner surface of the rear plate.

Preferably, the seat includes a well on a bottom, the well being configured to receive the insert.

Preferably, the handle includes a top projection.

It is another object of the invention to provide a stand comprising a base including a seat, a cover releasably secured to the seat and having a front groove and a cavity, and a PCB disposed in the seat, the PCB having a USB input header, a DC power connector, an audio header, a USB-C input header, and a plurality of USB output headers; a stem extending upward from the base and including a longitudinal hole in a top end, a rear plate having a lengthwise trough on an outer surface, an intermediate receptacle having a plurality of LEDs and a conductor electrically connected the LEDs to the PCB, a front transparent covering, a tubular member at a top end of the rear plate, and a sliding groove in the rear plate facing the receptacle; a pin configured to insert through a first end of an upper pivotal support and a first end of a lower pivotal support into the longitudinal hole to mount the upper and lower pivotal supports on the top end of the stem; and an attachment mechanism including an insert releasably secured to the seat, a guide member extending upward from an open end of the insert into the sliding groove, a handle secured to the guide member through the lengthwise trough of the rear plate, and two biasing members each having a lower end secured to a top of the guide member and an upper end urging against an inner surface of the rear plate.

The above and other objects, features and advantages of the invention will become apparent from the following detailed description taken with the accompanying drawings.

DETAILED DESCRIPTION OF THE INVENTION

Figure 1:
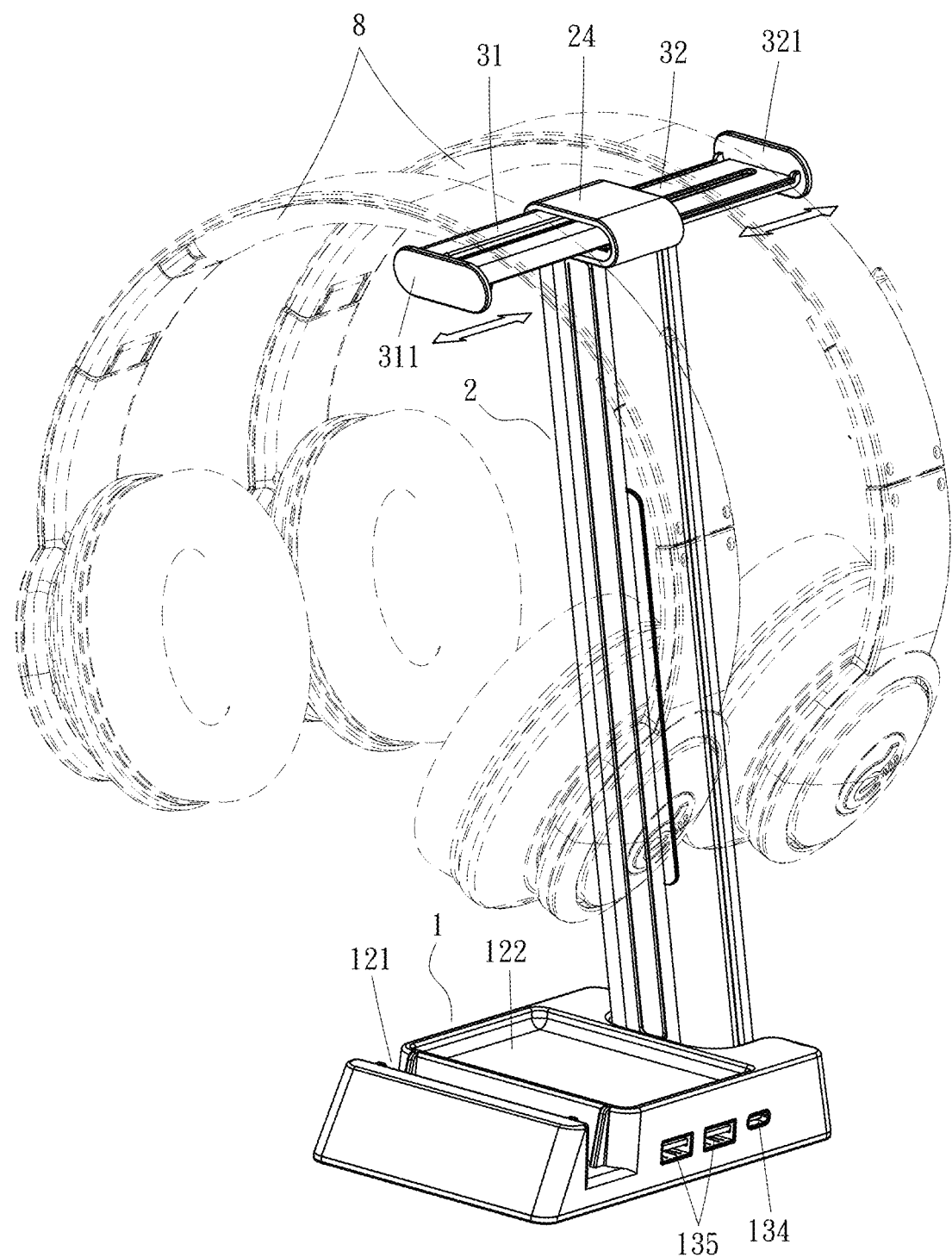
FIG. 1 is a perspective view of a multifunction stand according to a first preferred embodiment of the invention with two headphones hung on extended upper and lower slides respectively.
Figure 2:
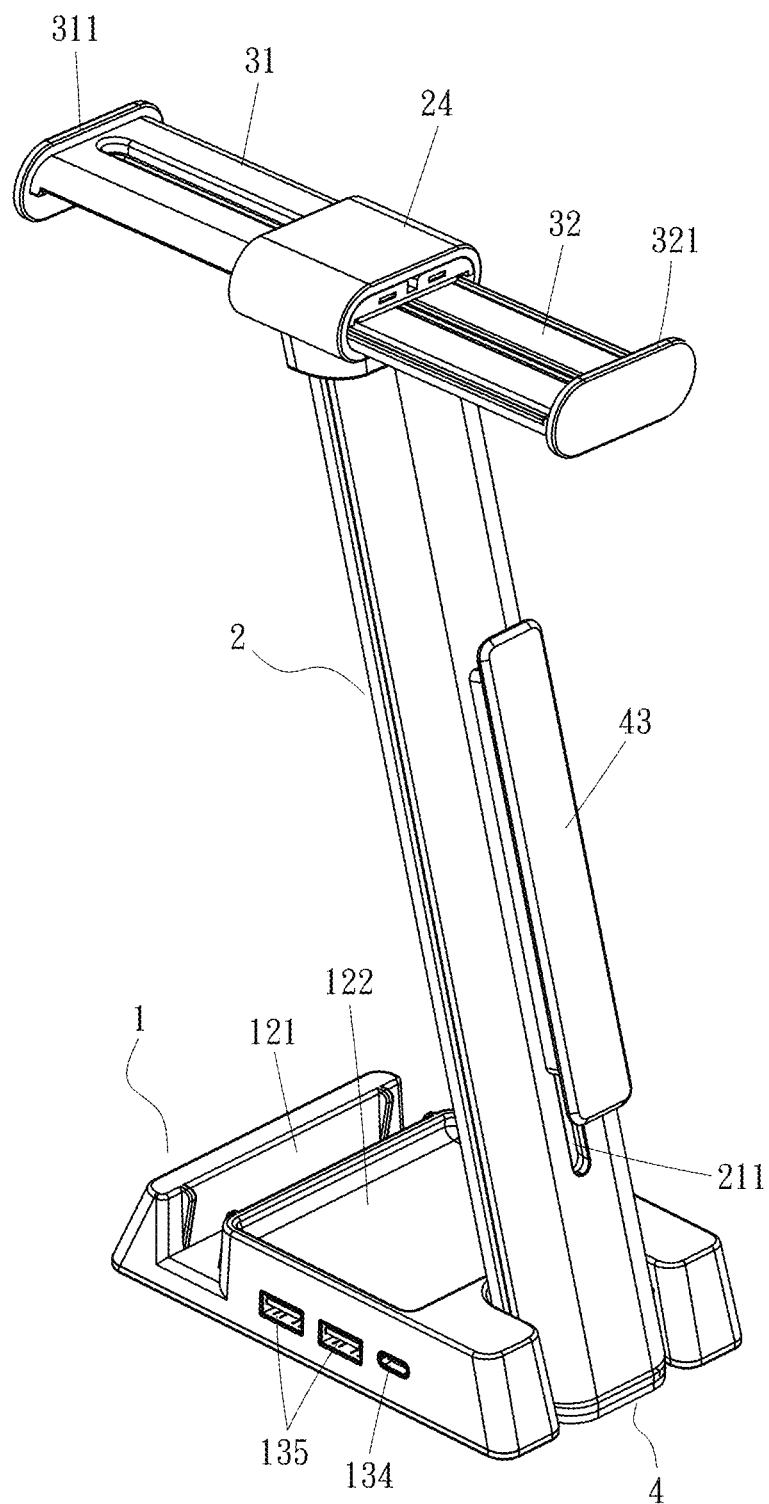
FIG. 2 is another perspective view of the multifunction stand.
Figure 3:
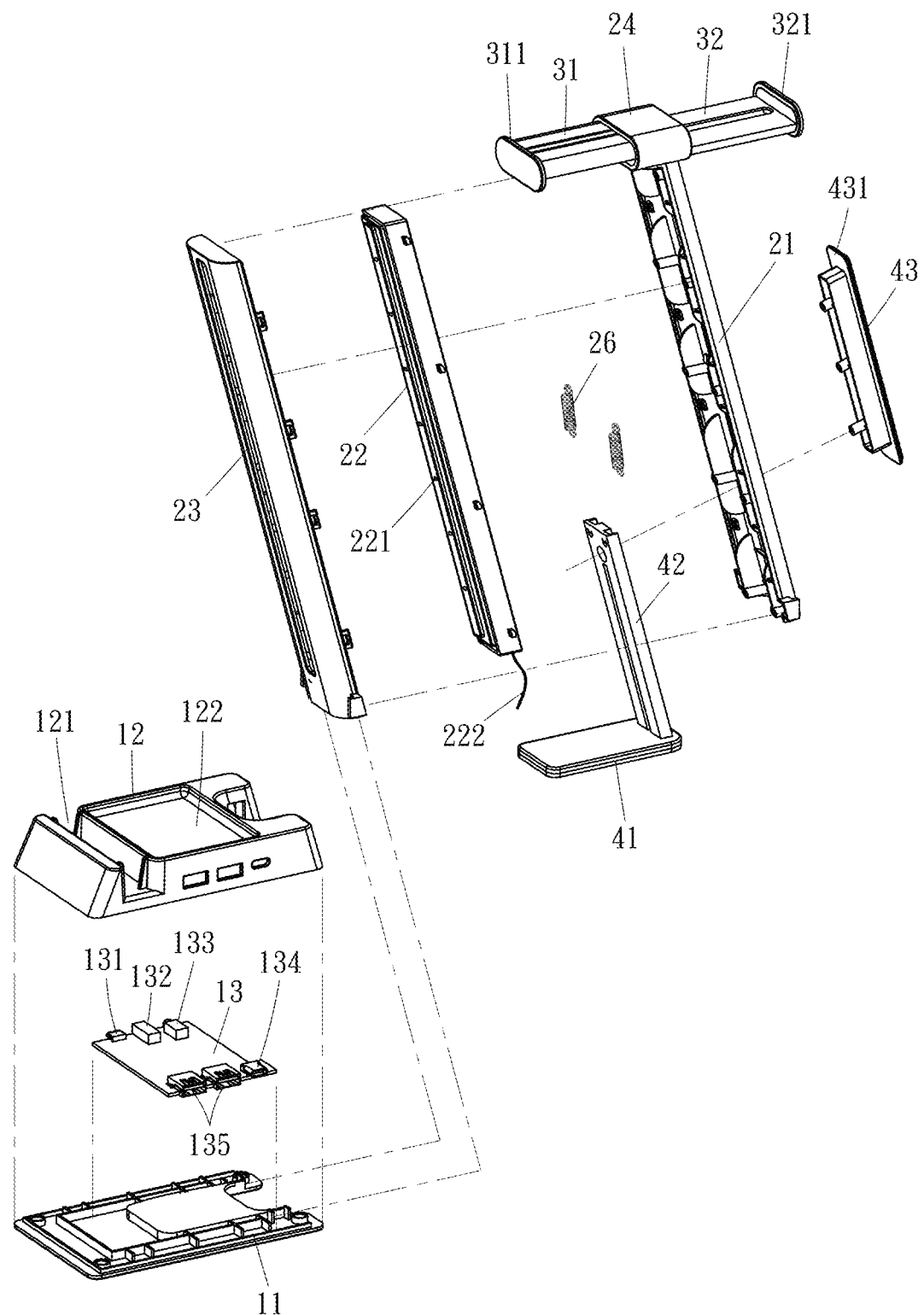
FIG. 3 is an exploded view of the multifunction stand.
Figure 4:
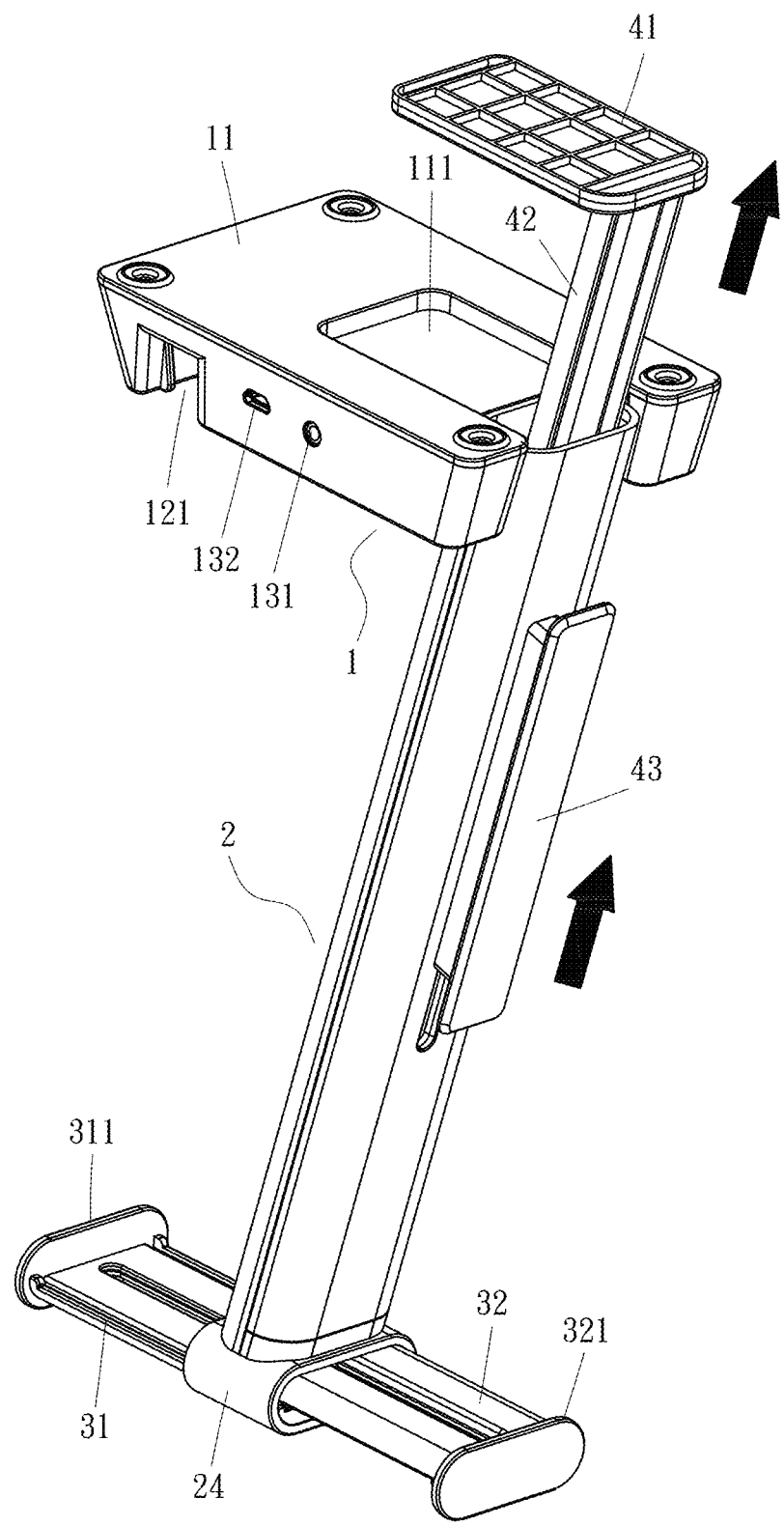
FIG. 4 is another upside down perspective view of the multifunction stand with the base disengaged from the insert by sliding.
Figure 5:
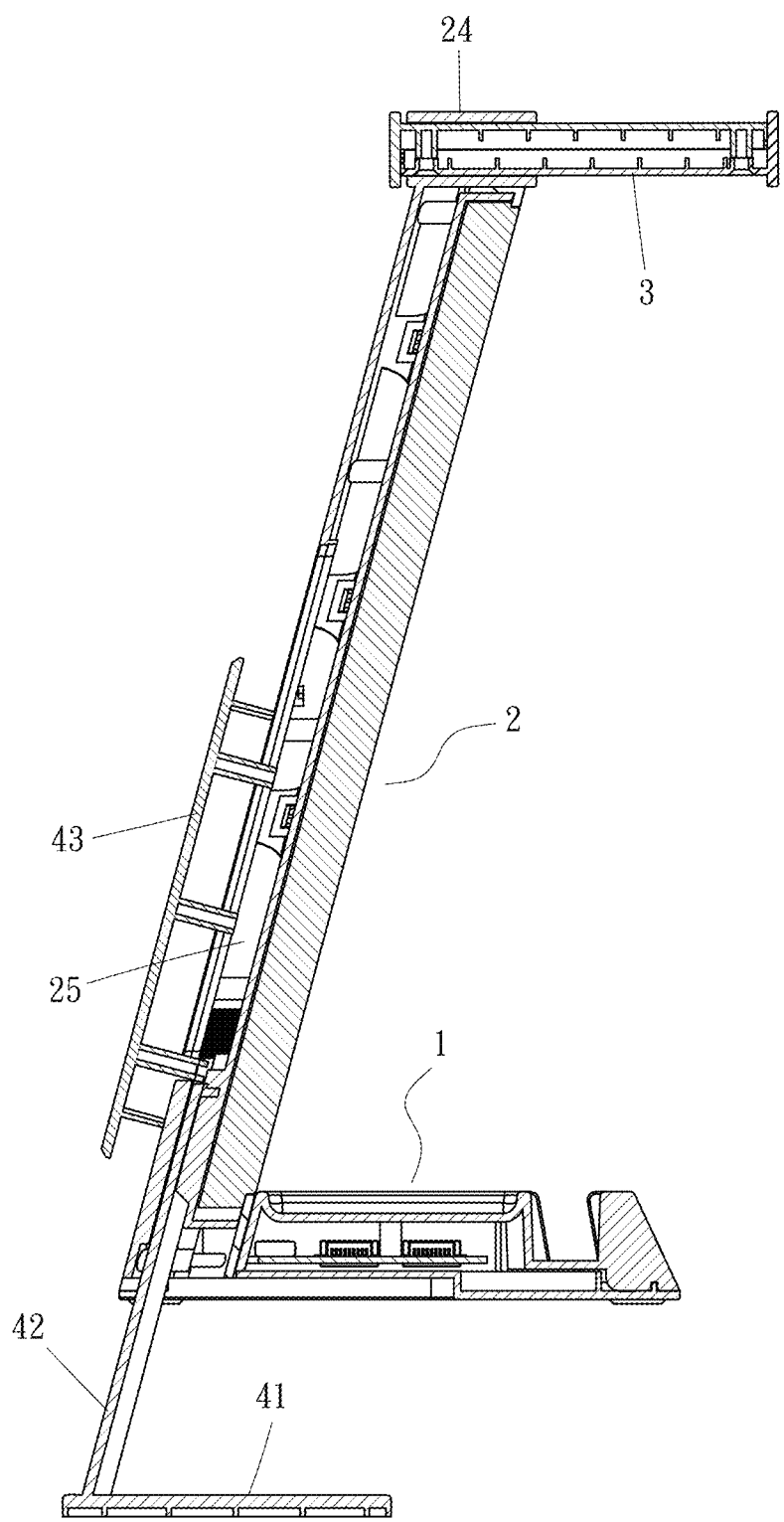
FIG. 5 is a longitudinal sectional view of the multifunction stand with the base disengaged from the insert by sliding.
Figure 6:
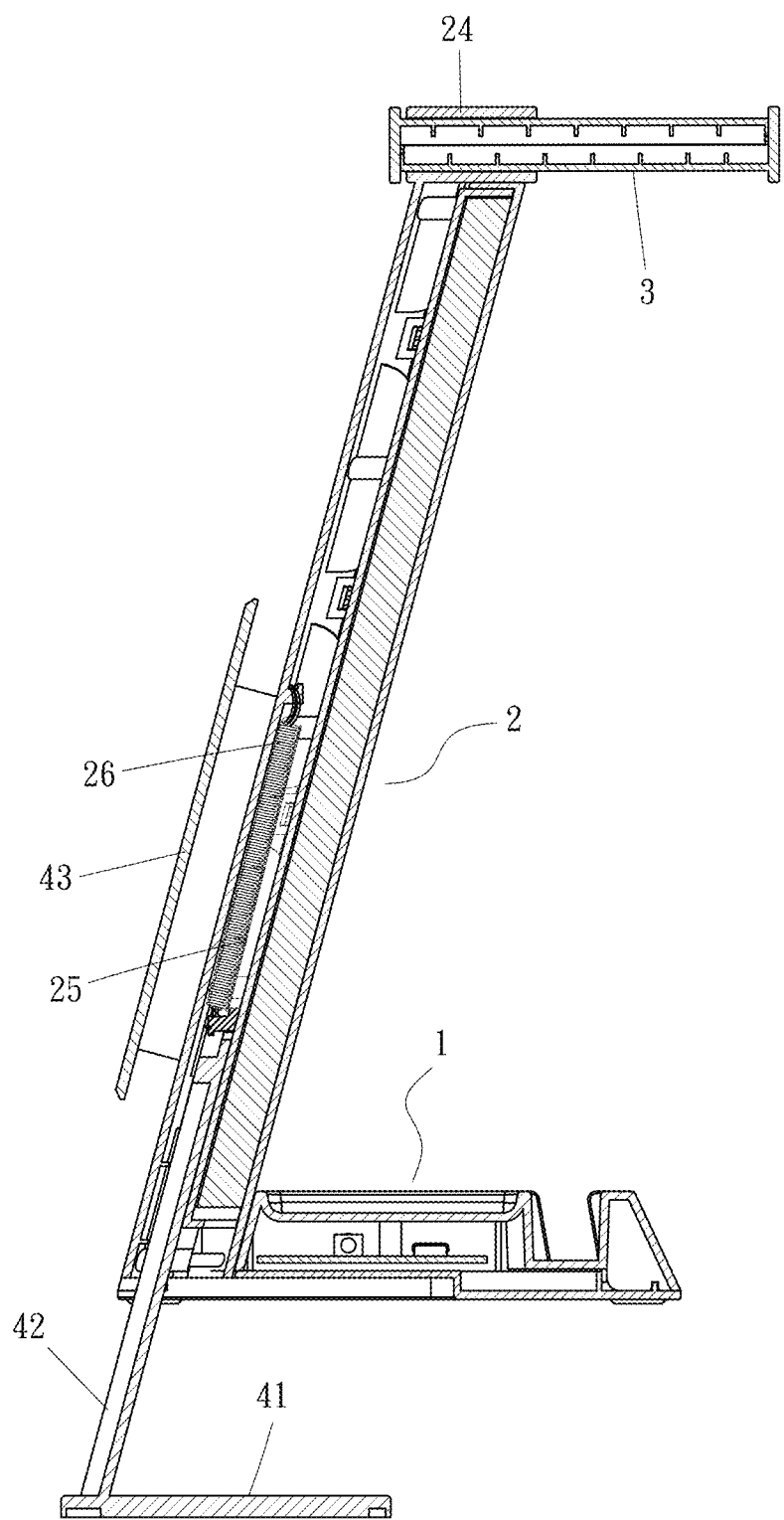
FIG. 6 is a view similar to FIG. 5 with the torsion spring being expanded.

Referring to FIGS. 1 to 8, a multifunction stand in accordance with a first preferred embodiment of the invention comprises a base 1, a stem 2 obliquely extending upward from the base 1, a holder 3 at a top end of the stem 2, and an attachment mechanism 4 as discussed in detail below.

The base 1 includes a seat 11, a cover 12 and a printed circuit board (PCB) 13 disposed in a space defined by the seat 11 and the cover 12. The PCB 13 includes a Universal Serial Bus (USB) input header 131, a direct current (DC) power connector 132, an audio header 133, a USB-C input header 134, and a plurality of USB output headers 135. Various electronic devices such as mobile phones 5, tablet computes 6, laptops 7, personal computers, monitors, keyboards, mouses, digital cameras and/or external hard disks may be connected to the PCB 13.

The cover 12 includes a front groove 121 for supporting the mobile phone 5 or the table computer 6 obliquely, and a shallow cavity 122 for storing small items. The seat 11 includes a well 111 on a bottom.

The stem 2 includes a rear plate 21 having a lengthwise trough 211 on an outer surface, an intermediate receptacle 22 having a plurality of light-emitting diodes (LEDs) 221 disposed therein and a conductor 222 electrically connected the LEDs 221 to the PCB 13, a front transparent covering 23, a tubular member 24 at a top end of the rear plate 21, and a sliding groove 25 in the rear plate 21 facing the receptacle 22. Light emitted by the LEDs 221 transmits through the transparent covering 23.

The holder 3 includes an upper slide 31 having a flange 311 at an open end, and a lower slide 32 having a flange 321 at an open end. The upper slide 31 and the lower slide 32 are configured to slide each other. Further, the upper slide 31 is configured to slide through the tubular member 24 until the flange 311 is stopped by the tubular member 24. Likewise, the lower slide 32 is configured to slide through the tubular member 24 until the flange 321 is stopped by the tubular member 24. Thus, a headphone 8 may be hung on the upper slide 31 after drawing out the upper slide 31 or the lower slide 32 after drawing out the lower slide 32.

The attachment mechanism 4 includes an insert 41 configured to insert into the well 111 to securely retain therein, a guide member 42 obliquely extending upward from an open end of the insert 41 into the sliding groove 25, and a handle 43 secured to the guide member 42 through the lengthwise trough 211 of the rear plate 21. Two torsion springs 26 each have a lower end secured to a top of the guide member 42 and an upper end urging against an inner surface of the rear plate 21. Thus, both the handle 43 and the guide member 42 are spring biased members. The handle 43 includes a top projection 431 for allowing wires to wrap around the projection 431.

As shown in FIG. 1 specifically, two headphones 8 are hung on the upper slide 31 and the lower slide 32 respectively.

Figure 7:
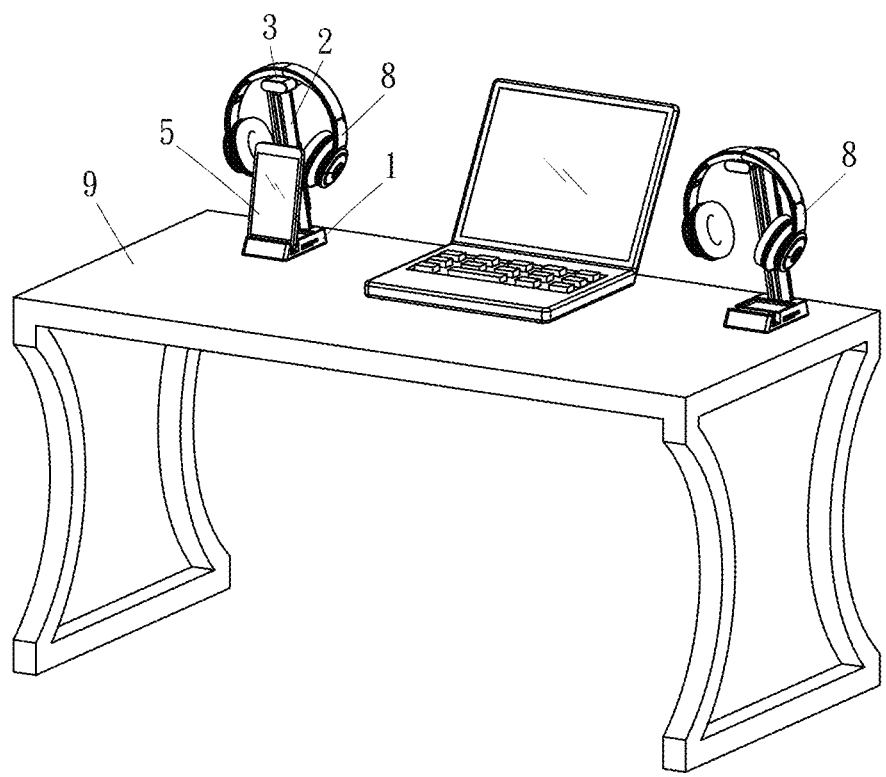
FIG. 7 is an environmental view of two multifunction stands placed on a table and electronic devices hung on the multifunction stands.

As shown in FIG. 7 specifically, two multifunction stands are placed on a table 9, a mobile phone 5 and a headphone 8 are supported by one multifunction stand, and another headphone 8 is supported by the other multifunction stand.

Figure 8:
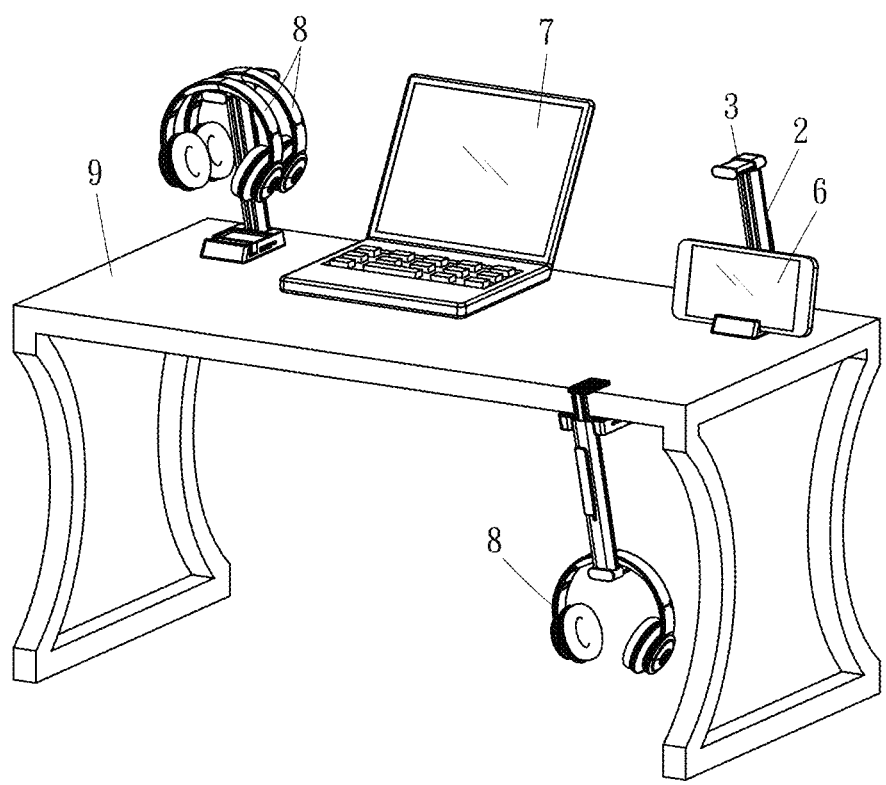
FIG. 8 is an environmental view of three multifunction stands placed on or secured to the table and electronic devices hung on or held by the multifunction stands.
Figure 9:
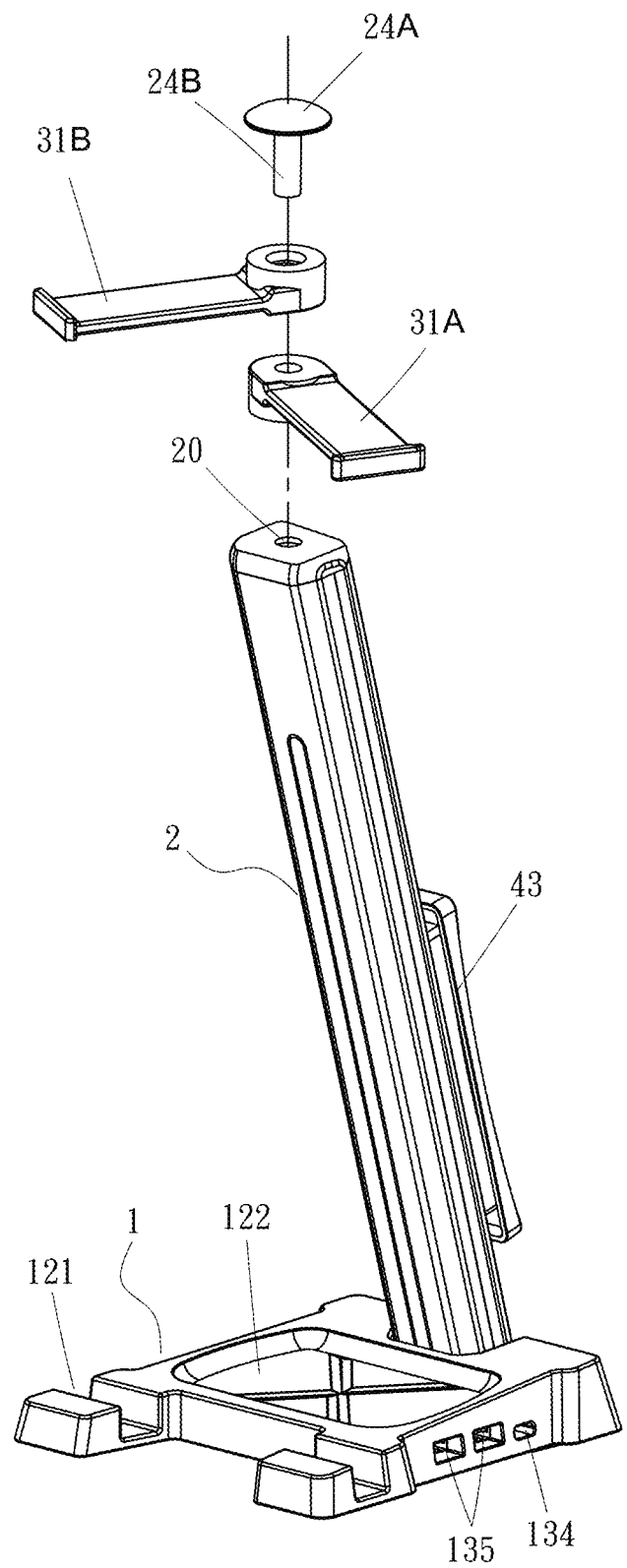
FIG. 9 is an exploded perspective view of a multifunction stand according to a second preferred embodiment of the invention.
Figure 10:
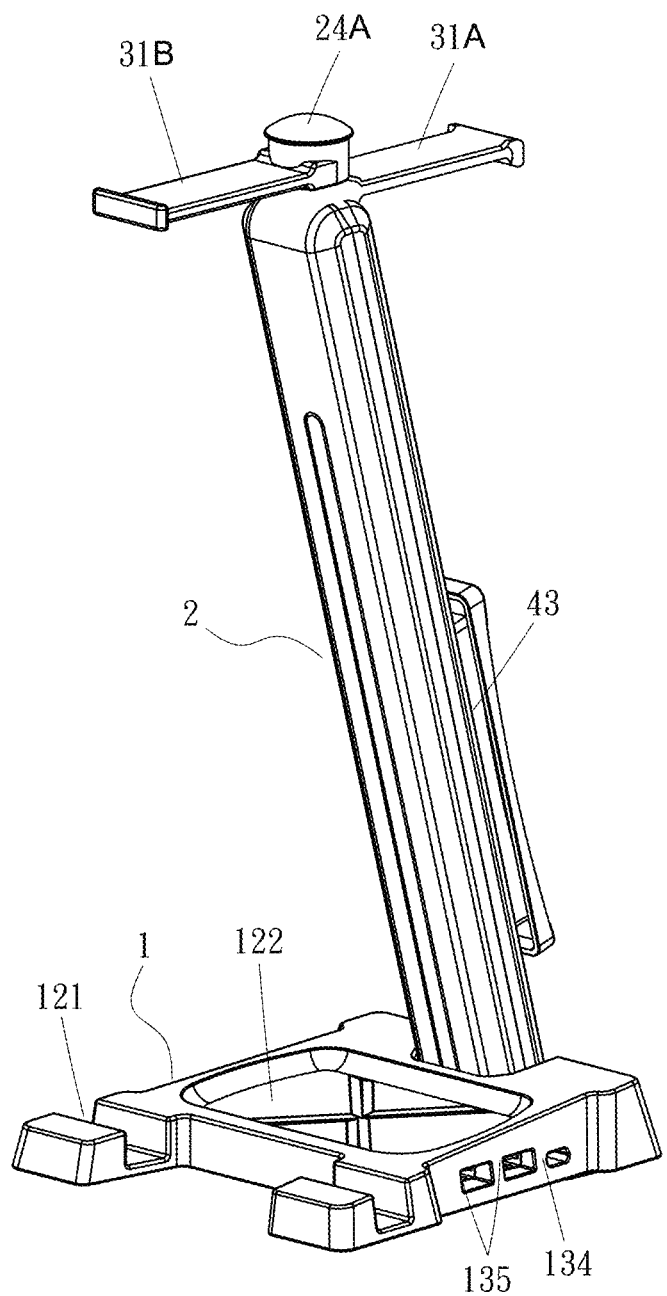
FIG. 10 is a perspective view of the assembled multifunction stand of FIG. 9.
Figure 11:
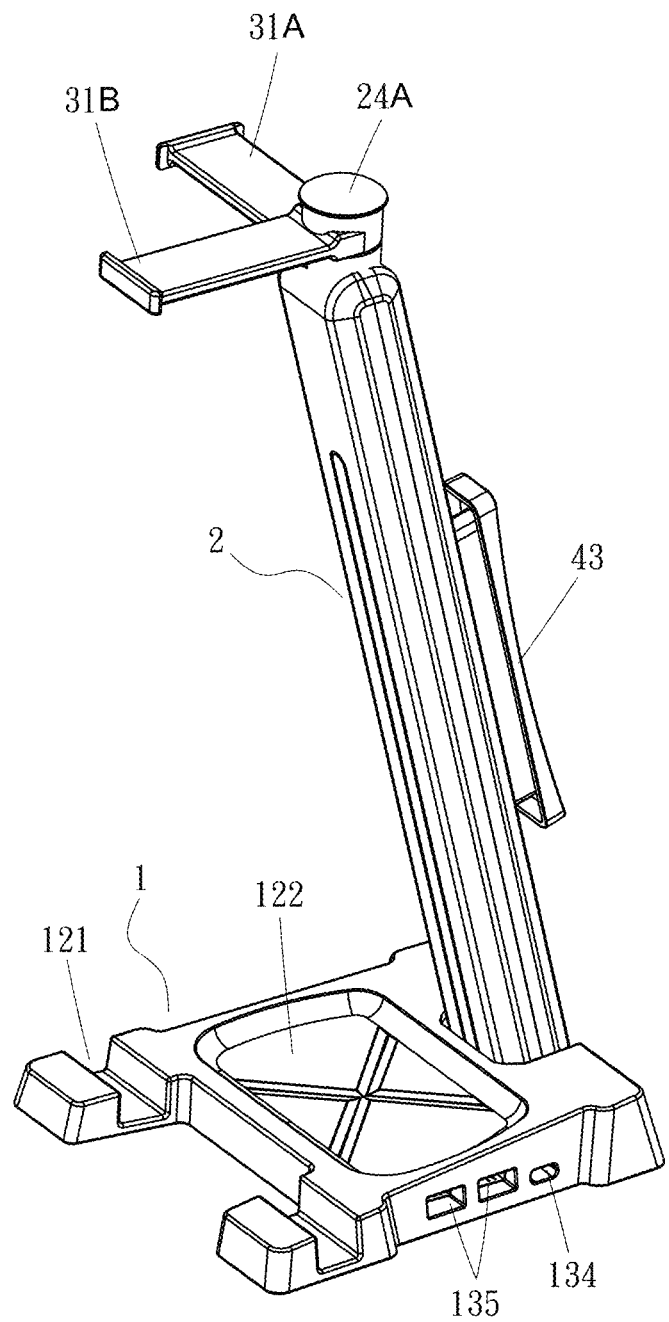
FIG. 11 is a view similar to FIG. 10 showing the lower pivotal support has been counterclockwise pivoted 90 degrees.
Figure 12:
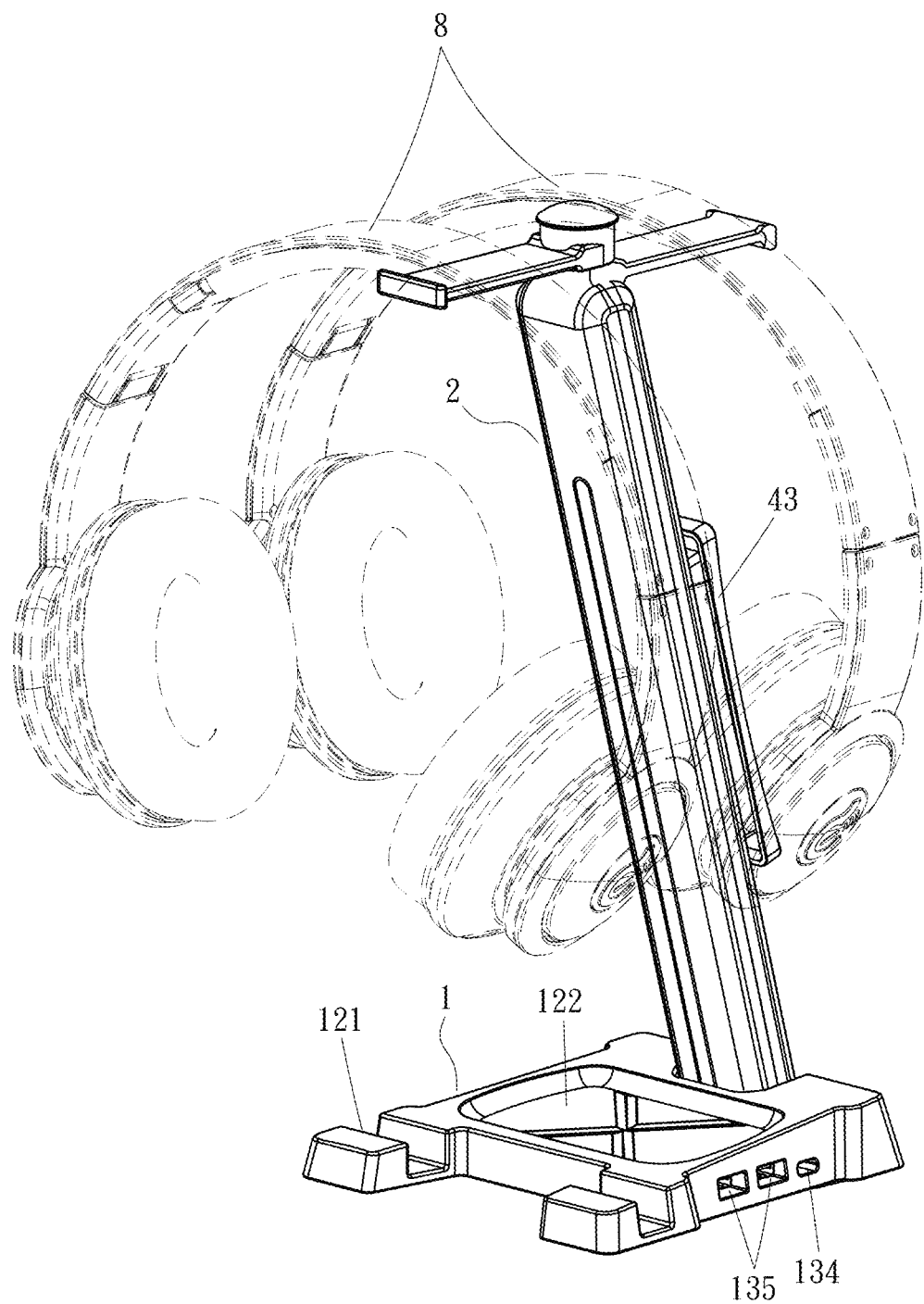
FIG. 12 is a perspective view of the multifunction stand of the second embodiment with two headphones hung on the upper and lower pivotal supports respectively.

As shown in FIG. 8 specifically, a laptop 7; two multifunction stands are placed on the table 9 in which two headphones 8 are hung on one multifunction stand, and a tablet computer 6 is supported by the other multifunction stand; and a multifunction stand is secured to a bottom of the table 9 and another headphone 8 is hung thereon.

Referring to FIGS. 9 to 12, a multifunction stand in accordance with a second preferred embodiment of the invention is shown and comprises a base 1, a stem 2 obliquely extending upward from the base 1, a holder 3 at a top end of the stem 2, and an attachment mechanism 4. The characteristics of the second preferred embodiment are substantially the same as that of the first preferred embodiment except the following: a longitudinal hole 20 is provided in a top of the stem 2. A pin 24A has a shaft 24B configured to insert through one end of an upper pivotal support 31B and one end of a lower pivotal support 31A into the longitudinal hole 20 to mount the upper and lower pivotal supports 31B and 31A on the top end of the stem 2. Two headphones 8 are adapted to hang on the upper and lower pivotal supports 31B and 31A respectively.

While the invention has been described in terms of preferred embodiments, those skilled in the art will recognize that the invention can be practiced with modifications within the spirit and scope of the appended claims.

What is claimed is:

1. A stand, comprising:
a base including a seat, a cover releasably secured to the seat and having a front groove and a cavity, and a PCB disposed in the seat, the PCB having a USB input header, a DC power connector, an audio header, a USB-C input header, and a plurality of USB output headers;
a stem extending upward from the base and including a rear plate having a lengthwise trough on an outer surface, an intermediate receptacle having a plurality of LEDs and a conductor electrically connected the LEDs to the PCB, a front transparent covering, a tubular member at a top end of the rear plate, and a sliding groove in the rear plate facing the receptacle;
a holder at a top end of the stem and including an upper slide having a flange at an open end, and a lower slide having a flange at an open end wherein the upper slide and the lower slide are configured to slide each other, the upper slide is configured to slide through the tubular member, and the lower slide is configured to slide through the tubular member; and
an attachment mechanism including an insert releasably secured to the seat, a guide member extending upward from an open end of the insert into the sliding groove, a handle secured to the guide member through the lengthwise trough of the rear plate, and two biasing members each having a lower end secured to a top of the guide member and an upper end urging against an inner surface of the rear plate.

2. The stand of claim 1, wherein the seat includes a well on a bottom, the well being configured to receive the insert.

3. The stand of claim 1, wherein the handle includes a top projection.

4. A stand, comprising:
a base including a seat, a cover releasably secured to the seat and having a front groove and a cavity, and a PCB disposed in the seat, the PCB having a USB input header, a DC power connector, an audio header, a USB-C input header, and a plurality of USB output headers;
a stem extending upward from the base and including a longitudinal hole in a top end, a rear plate having a lengthwise trough on an outer surface, an intermediate receptacle having a plurality of LEDs and a conductor electrically connected the LEDs to the PCB, a front transparent covering, a tubular member at a top end of the rear plate, and a sliding groove in the rear plate facing the receptacle;
a pin configured to insert through a first end of an upper pivotal support and a first end of a lower pivotal support into the longitudinal hole to mount the upper and lower pivotal supports on the top end of the stem; and
an attachment mechanism including an insert releasably secured to the seat, a guide member extending upward from an open end of the insert into the sliding groove, a handle secured to the guide member through the lengthwise trough of the rear plate, and two biasing members each having a lower end secured to a top of the guide member and an upper end urging against an inner surface of the rear plate.

\* \* \* \* \*